(12) United States Patent
Kim et al.

(10) Patent No.: US 8,890,574 B2
(45) Date of Patent: Nov. 18, 2014

(54) CIRCUIT FOR PREVENTING SELF-HEATING OF METAL-INSULATOR-TRANSITION (MIT) DEVICE AND METHOD OF FABRICATING INTEGRATED-DEVICE FOR THE SAME CIRCUIT

(75) Inventors: Hyun-Tak Kim, Daejeon (KR); Bong-Jun Kim, Daejeon (KR); Sun-Jin Yun, Daejeon (KR); Dae-Yong Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 371 days.

(21) Appl. No.: 12/919,195

(22) PCT Filed: Feb. 23, 2009

(86) PCT No.: PCT/KR2009/000834
§ 371 (c)(1),
(2), (4) Date: Aug. 24, 2010

(87) PCT Pub. No.: WO2009/107948
PCT Pub. Date: Sep. 3, 2009

(65) Prior Publication Data
US 2011/0043141 A1 Feb. 24, 2011

(30) Foreign Application Priority Data

Feb. 25, 2008 (KR) .................. 10-2008-0016935
Sep. 17, 2008 (KR) .................. 10-2008-0091265
Jan. 13, 2009 (KR) .................. 10-2009-0002732

(51) Int. Cl.
*H03K 19/20* (2006.01)
*H01L 49/00* (2006.01)
*H01L 27/06* (2006.01)

(52) U.S. Cl.
CPC ............ *H01L 27/067* (2013.01); *H01L 49/003* (2013.01)
USPC .............. 326/104; 326/83; 219/494; 219/501

(58) Field of Classification Search
USPC ............................ 361/54, 56, 91.1, 111, 118; 257/173–175, 310, 368; 326/104, 8, 326/136; 438/2, 301; 219/494, 501, 505; 327/512, 541, 543
See application file for complete search history.

(56) References Cited

U.S. PATENT DOCUMENTS 3,534,241 A  10/1970  Wilson et al.
4,316,080 A * 2/1982  Wroblewski .................. 219/505
(Continued)

FOREIGN PATENT DOCUMENTS

JP    01-105570      4/1989
JP    02242123 A     9/1990
(Continued)

*Primary Examiner* — Thienvu Tran
*Assistant Examiner* — Christopher Lo
(74) *Attorney, Agent, or Firm* — Rabin & Berdo, P.C.

(57) ABSTRACT

Provided are a MIT device self-heating preventive-circuit that can solve a self-heating problem of a MIT device and a method of manufacturing a MIT device self-heating preventive-circuit integrated device. The MIT device self-heating preventive-circuit includes a MIT device that generates an abrupt MIT at a temperature equal to or greater than a critical temperature and is connected to a current driving device to control the flow of current in the current driving device, a transistor that is connected to the MIT device to control the self-heating of the MIT device after generating the MIT in the MIT device, and a resistor connected to the MIT device and the transistor.

24 Claims, 13 Drawing Sheets

(56) References Cited

U.S. PATENT DOCUMENTS

| | | | | |
|---|---|---|---|---|
| 5,763,929 | A * | 6/1998 | Iwata | 257/467 |
| 6,624,463 | B2 * | 9/2003 | Kim et al. | 257/310 |
| 6,890,766 | B2 * | 5/2005 | Doderer et al. | 438/2 |
| 8,305,221 | B2 * | 11/2012 | Kim et al. | 340/584 |
| 2007/0069193 | A1 * | 3/2007 | Yoon et al. | 257/8 |
| 2007/0072060 | A1 * | 3/2007 | Chang et al. | 429/62 |
| 2007/0085122 | A1 * | 4/2007 | Hyun et al. | 257/296 |
| 2007/0216602 | A1 * | 9/2007 | Fujino | 345/44 |
| 2008/0130288 | A1 * | 6/2008 | Catalano et al. | 362/294 |
| 2009/0102396 | A1 * | 4/2009 | Petrucci et al. | 315/294 |

FOREIGN PATENT DOCUMENTS

| | | |
|---|---|---|
| JP | 2004-096318 A | 3/2004 |
| JP | 2009-502020 A | 1/2009 |
| KR | 20070011178 A | 1/2007 |
| KR | 2007-0115571 A | 12/2007 |
| WO | WO-2005/041308 A1 | 5/2005 |
| WO | WO-2006/075878 A2 | 7/2006 |
| WO | WO-2007/011175 A1 | 1/2007 |
| WO | WO-2007/142423 A1 | 12/2007 |

* cited by examiner

CIRCUIT FOR PREVENTING SELF-HEATING OF METAL-INSULATOR-TRANSITION (MIT) DEVICE AND METHOD OF FABRICATING INTEGRATED-DEVICE FOR THE SAME CIRCUIT

CROSS-REFERENCE TO RELATED PATENT APPLICATION

This application claims the benefits of Korean Patent Application No. 10-2008-0016935, filed on Feb. 25, 2008, No. 10-2008-0091265, filed on Sep. 17, 2008, and No. 10-2009-0002732, filed on Jan. 13, 2009, in the Korean Intellectual Property Office, the disclosures of which are incorporated herein in their entirely by reference.

BACKGROUND OF THE INVENTION

1. Field of the Invention

The present invention relates to a Metal-Insulator-Transition (MIT) device, and more particularly, to a circuit for preventing a MIT device from self-heating and a method of fabricating an integrated device in which the circuit is integrated.

2. Description of the Related Art

A Metal-Insulator-Transition (MIT) device generates a metal-insulator-transition (MIT) phenomenon in which an insulator transits to a metal or a metal transits to an insulator according to various physical characteristics such as voltage, electric field, electromagnetic wave, temperature, or pressure. For example, in a MIT device, a metal-insulator transition occurs at a temperature equal to or greater than a critical temperature. Thus, the MIT device can be used as a device that can protect an electric-electronic device from heat using the MIT generation characteristic according to temperature.

Also, in a MIT device that generates a MIT phenomenon, when the ambient temperature of the MIT device is increased greater than the critical temperature of the MIT device, the MIT phenomenon occurs in the MIT device, and accordingly, a high current (a current density of greater than $10^5$ A/cm$^2$) flows through the MIT device. However, a phenomenon of the high current continuously flowing in the MIT device occurs although the ambient temperature of the MIT device is reduced below the critical temperature, and the phenomenon is referred to as a self-heating of the MIT device. The self-heating interferes a switching operation or causes failures of the switching operation of the MIT device, and thus, eventually causes a malfunction of a current driving device.

For example, if a MIT device is used as a current driving device, such as a relay, a light emitting device, a buzzer, or a heater, the MIT device can be used as an over-current protective device. If an over-current is applied to the MIT device or malfunctions occur in the current driving device, there is a high possibility that the self-heating phenomenon described above can occur in the MIT device.

Since the MIT device is not yet commercialized, the self-heating of the MIT device is not well known. However, in order to appropriately put the MIT device into practice, the problem of the self-heating of the MIT device must be addressed. However, the self-heating of the MIT device is still as an unsolved problem in the fields of studying the MIT device and its application.

SUMMARY OF THE INVENTION

The present invention provides a circuit for preventing a MIT device from self-heating, as described above, and a method of fabricating an integrated device in which the circuit is integrated.

According to an aspect of the present invention, there is provided a metal-insulator transition (MIT) device self-heating preventive-circuit comprising: a MIT device that generates an abrupt MIT at a temperature equal to or greater than a critical temperature and is connected to a current driving device to control the flow of current in the current driving device; a transistor that is connected to the MIT device to control the self-heating of the MIT device after generating the MIT in the MIT device; and a resistor connected to the MIT device and the transistor.

The transistor may be a bipolar transistor, the MIT device may be connected between a base electrode and a collector electrode of the bipolar transistor, and the resistor may be connected between the base electrode and an emitter electrode of the bipolar transistor. For example, the bipolar transistor may be one of an NPN type transistor and a PNP type transistor.

The transistor may be a Metal-Oxide-Semiconductor (MOS) transistor, the MIT device may be connected between a gate electrode and a drain electrode of the MOS transistor, and the resistor may be connected between the gate electrode and a source electrode of the MOS transistor. For example, the MOS transistor is one of a P-MOS, a N-MOS, and a C-MOS transistor.

The MIT device self-heating preventive-circuit may be formed to a structure in which the MIT device, the transistor, and the resistor are integrated and packaged into one chip.

If the MIT device self-heating preventive-circuit has a packaged structure in which the MIT device self-heating preventive-circuit is integrated, the MIT device self-heating preventive-circuit may have a structure that comprises: a substrate; a transistor formed on a central portion of the substrate; the MIT device formed on a side of the transistor on the substrate; and a resistor formed on the other side of the transistor on the substrate.

At this point, the MIT device may comprise a MIT thin film formed on an insulating film on the substrate and at least two MIT electrodes formed on both sides of the MIT thin film on the insulating film, and the resistor may comprise a resistance thin film formed on the insulating film on the substrate and two resistance electrodes formed on both sides of the resistance thin film on the insulating film.

The MIT device may generate a MIT due to the change of physical characteristics of a material, such as temperature, pressure, voltage, and electromagnetic waves. The MIT device may comprise a MIT thin film that generates MIT at a temperature equal to or greater than a critical temperature. For example, the MIT device may be formed of $VO_2$.

According to an aspect of the present invention, there is provided a method of manufacturing a MIT device self-heating preventive-circuit integrated device comprising: forming a transistor and a resistor on a substrate comprising: preparing a substrate; forming an active region in the substrate to form a transistor on the substrate; forming a resistance thin film on the substrate; and forming electrodes that contact the active region and the resistance thin film; and forming a MIT device on the substrate.

The method may further comprise forming an insulating film on the substrate before or after forming of the active region, and may further comprise exposing a portion of the active region by etching a predetermined portion of the insulating film prior to forming of the electrodes.

The forming of the MIT device may comprises: forming an MIT thin film on the substrate; patterning the MIT thin film to a predetermined size using a photolithography process; and forming at least two MIT electrodes that contact the patterned MIT thin film. The MIT electrodes may be formed using a lift-off photolithography process. The MIT electrodes may comprise an interlayer thin film, in which Ni/Ti/V are sequentially stacked in the order stated, and an Au thin film formed on the interlayer thin film.

In the forming of the MIT electrodes, the MIT electrodes may be connected to the transistor and the electrodes of the resistor.

The present invention also provides a current control circuit including: a metal-insulator transition (MIT) device in which an abrupt MIT is generated at a temperature equal to or greater than a critical temperature; and a current driving device connected parallel to the MIT device, wherein the MIT device controls a current applied to the current driving device.

The present invention also provides a current control circuit including: a metal-insulator transition (MIT)-transistor comprising a MIT device generating an abrupt metal-insulator transition at a temperature equal to or greater than a critical temperature and a control transistor connected to the MIT device; and at least one power transistor that is connected to a current driving device to supply power to the current driving device and to control the power to the current driving device, wherein the MIT-transistor is attached to a surface of the power transistor or a heating portion of the power transistor, and is connected to a base electrode, a gate electrode, a collector electrode, or a drain electrode of the power transistor, and when the temperature of the power transistor increases, the MIT-transistor reduces or cuts a current of the power transistor to prevent heating of the power transistor.

The present invention also provides a diode current control circuit comprising: at least one current control device whose resistance varies according to temperature; and at least two diodes connected to the current control device, wherein one of the at least two diodes is connected parallel to the current control device, and the other of the at least two diodes is connected in series to the current control device, and wherein the current control device controls power supply to the at least two diodes.

The present invention also provides a power system including one of the above control circuits.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
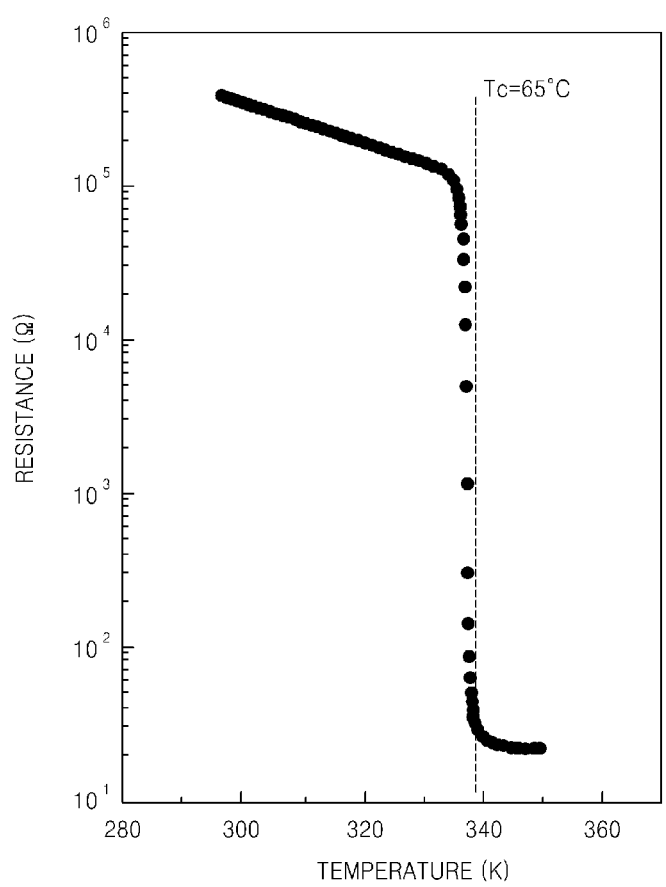
FIG. 1 is a graph showing the variation of resistance according to temperature of a Metal-Insulator-Transition (MIT) device formed of $VO_2$.

The present invention will now be described more fully with reference to the accompanying drawings, in which exemplary embodiments of the invention are shown. The present invention may, however, be embodied in many different forms and should not be construed as being limited to the embodiments set forth herein; rather, these embodiments are provided so that this disclosure will be thorough and complete, and will fully convey the concept of the invention to one skilled in the art. It will also be understood that when a layer is referred to as being "on" another layer or substrate, it can be directly on the other layer or substrate, or intervening layers may also be present. In the drawings, the thicknesses of layers and regions are exaggerated for clarity and portions nothing to do with the description are omitted. Like reference numerals in the drawings denote like elements, and thus their description will be omitted. The terminology used herein is for the purpose of describing exemplary embodiments only and is not intended to limit the invention described in the claims. In describing the present invention, if detailed explanations related to some well-known functions or configurations are believed to blur the spirit of the present invention, the detailed descriptions thereof are omitted.

FIG. 1 is a graph showing the variation of resistance according to temperature of a metal-insulator transition (MIT) device formed of $VO_2$. The X-axis represents absolute temperature in Kelvins (K) and the Y-axis represents resistance in ohms ($\Omega$), and a predetermined voltage is applied to the MIT device.

Referring to FIG. 1, the MIT device shows characteristics of an insulator having a resistance of greater than $10^5 \Omega$ at a temperature of below 340 K, and shows characteristics of a metal having a resistance of a few tens of $\Omega$ due to a rapid transition that is discontinuous at a temperature of greater than 340 K. Thus, referring to the graph, since the MIT device has a discontinuous transition at a temperature of 340 K, it can be seen that the critical temperature of the MIT device is approximately 340 K.

Although not shown, in the case of the voltage-current graph of a MIT device, it can be seen that the current rapidly increases at the critical temperature due to a discontinuous jump and the voltage is reduced. Here, the generation of MIT according to temperature has been described; however, the MIT may be generally generated due to various physical characteristics such as pressure, voltage, electromagnetic field, electromagnetic wave, etc. However, these physical characteristics are not directly related to the spirit of the present invention, and thus, the generation of the MIT due to physical characteristics is omitted.

The MIT device may include a MIT thin film on which the MIT is generated due to the physical characteristics described above and electrodes that contact the MIT thin film. Also, the MIT device may be configured as a vertical type structure in which the MIT device is perpendicularly formed with respect to a substrate or a horizontal type structure in which the MIT device is horizontally formed on the substrate. The MIT device used in the present experiment is formed using a MIT thin film formed of $VO_2$, however, the material used to form the MIT device is not limited to $VO_2$, and thus the MIT device may be formed using a MIT thin film formed of a new material or a material that has a discontinuous jump characteristic due to various physical characteristics. Also, the MIT thin film may be formed as a ceramic thin film type or a single crystal thin film type.

Figure 2A:
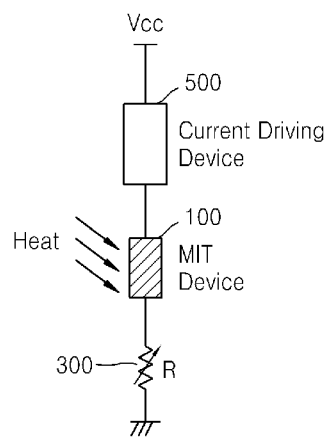
FIG. 2A is a schematic circuit diagram in which a MIT device formed of $VO_2$ is connected to a current driving device.

FIG. 2A is schematic circuit diagram of a circuit in which a MIT device 100 formed of $VO_2$ is connected to a current driving device 500.

Referring to FIG. 2A, the MIT device 100 may be connected to the current driving device 500 in series. Here, the current driving device 500 may be, for example, an electronic device such as a relay, a light emitting diode, a transistor, a buzzer, or a heater. In a circuit having the above configuration, when heat is generated in the current driving device 500 due to an over current or a malfunction, the MIT device 100 causes MIT to pass a high current, and thus, protects the current driving device 500. Here, a variable resistor device 300, for example, a variable resistance is connected between the ground and the MIT device 100 to protect the MIT device 100; however, the variable resistor device 300 may be omitted.

In a circuit having the configuration described above, a self-heating phenomenon of a MIT device, as described in the description of related art, occurs. Thus, the present invention provides a method of preventing the self-heating phenomenon of the MIT device, and the method will now be described more in detail with reference to FIG. 4A.

Figure 2B:
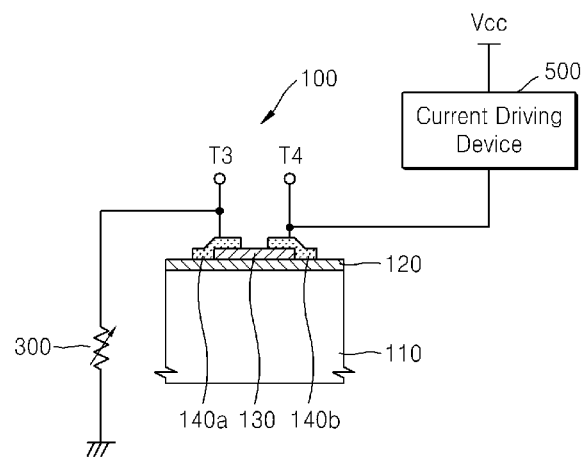
FIG. 2B is a more detailed configuration of the MIT device of FIG. 2A.

FIG. 2B is a more detailed configuration of the MIT device 100 of the circuit of FIG. 2A.

Referring to FIG. 2B, the MIT device 100 connected to the current driving device 500 has a horizontal type structure. That is, the MIT device 100 includes a substrate 110, an insulating film 120 formed on the substrate 110, a MIT thin film 130 formed of an insulating film, and two MIT electrodes 140a and 140b formed lateral to the MIT thin film 130. The current driving device 500 is connected to the MIT electrode 140b of the MIT device 100 and the resistor 300 is connected to the other MIT electrode 140a of the MIT device 100.

In the current embodiment, the MIT device 100 having a horizontal type structure has been described. However, the MIT device 100 having a vertical type structure can also be used to protect the current driving device 500.

Figure 3:
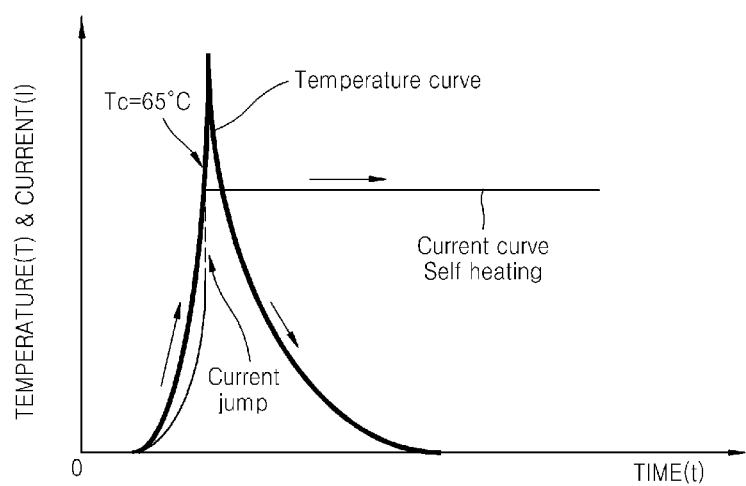
FIG. 3 is a graph showing temperature and current of the MIT device of FIG. 2A according to time, that is, shows a self-heating phenomenon of the MIT device.

FIG. 3 is a graph showing temperature and current of the MIT device of FIG. 2A according to time, that is, shows a self-heating phenomenon of the MIT device. The X-axis represents time and the Y-axis represents temperature and current. The bold line indicates an ambient temperature curve of the MIT device 100, for example, a current driving device 500, and the solid line indicates a curve of current that flows through the MIT device 100.

Referring to FIG. 3, if the ambient temperature increases beyond a critical temperature, for example, 65° C., the MIT device 100 changes into a metal state (turn-on state) through a metal-insulator transition (MIT), and thus, a current jump (dotted line) is caused and a high current (a current density of greater than $10^5$ A/cm$^2$) flows through the MIT device 100. As a result, the ambient temperature, that is, the temperature of the current driving device 500 is reduced below the critical temperature. Meanwhile, if the ambient temperature is reduced below the critical temperature, the turn-on state of the MIT device 100 must return to an insulator state (turn-off state) and, as a result, the current must be reduced. However, although the ambient temperature is reduced below the critical temperature, the high current still flows through the MIT device 100. This phenomenon occurs due to the self-heating of the MIT device 100, and is referred to as a self-heating phenomenon of a MIT device, as described above. Due to the self-heating phenomenon of the MIT device, the high current continuously flows through the MIT device 100, the switching operation of the MIT device 100 is interrupted, and as a result, a normal operation of the current driving device 500 is interrupted or a malfunction of the current driving device 500 is caused.

Figure 4A:
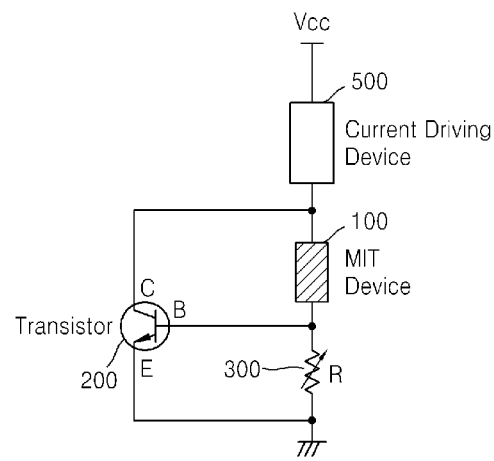
FIG. 4A is a MIT device self-heating preventive-circuit according to an embodiment of the present invention.

FIG. 4A is a MIT device self-heating preventive-circuit according to an embodiment of the present invention.

Referring to FIG. 4A, the MIT device self-heating preventive-circuit includes the MIT device 100 connected to the current driving device 500, and also, includes a bipolar transistor 200 and a resistor 300 connected to the MIT device 100. In the current embodiment, an NPN type bipolar transistor is depicted; however, a PNP type transistor can also be used. Also, a metal-oxide semiconductor (MOS) transistor can be used instead of the bipolar transistor, as will be described with reference to FIGS. 6A and 6B.

Each of the devices is connected as follows. The MIT device 100 is connected between a collector electrode and a base electrode of the bipolar transistor 200, and the resistor 300 is connected between an emitter electrode and the base electrode. Meanwhile, the collector electrode and a first electrode of the MIT device 100 are connected to the current driving device 500, and a second electrode of the MIT device 100 and a first electrode of the resistor 300 are connected to the base electrode of the bipolar transistor 200, and the emitter electrode of the bipolar transistor 200 and a second electrode of the resistor 300 are connected to the ground. Here, the bipolar transistor 200 is a NPN type transistor, and thus, if a PNP type bipolar transistor is used, each of the electrodes must be connected in consideration of opposite polarity.

An operation of the MIT device self-heating preventive-circuit according to the current embodiment will now be described. If an ambient temperature, for example, the temperature of the current driving device 500 is increased due to an over current, a MIT is caused in the MIT device 100, and thus, a high current flows through the MIT device 100. Meanwhile, in the case of the bipolar transistor 200, before generating a MIT, the bipolar transistor 200 is in a turn-off state since a voltage difference between the emitter and the base electrode is small. That is, a majority of the voltage is applied to the MIT device 100 and a negligible voltage is applied to the resistor 300, and thus, the voltage difference between the emitter electrode and the base electrode cannot cross over a threshold voltage. However, in the case when a MIT is generated in the MIT device 100, the MIT device 100 is in a metal state, and thus, a high current flows through the MIT device 100, and as a result, a low voltage is applied to the MIT device 100 and a large voltage is applied to the resistor 300. That is, a large voltage is applied to the base electrode of the bipolar transistor 200. Thus, the bipolar transistor 200 is turned-on and a current flows through the bipolar transistor 200. As a result, the current that flows through the MIT device 100 is reduced. Also, the MIT device 100 returns to an insulation state as the current is reduced, and accordingly, the bipolar transistor 200 returns to a turned-off state.

That is, since the MIT device self-heating preventive-circuit according to the current embodiment includes the bipolar transistor 200, a high current bypasses through the bipolar transistor 200 that is turned-on immediately after generating a MIT in the MIT device 100. Therefore, the self-heating of the MIT device 100 can be prevented, and accordingly, the continuous flow of a high current at a temperature below a critical temperature, which is caused due to a self-heating of a conventional MIT device, can be prevented. Accordingly, a normal switching operation of the MIT device 100 is possible, and thus, the current driving device 500 can stably perform its function.

Figure 4B:
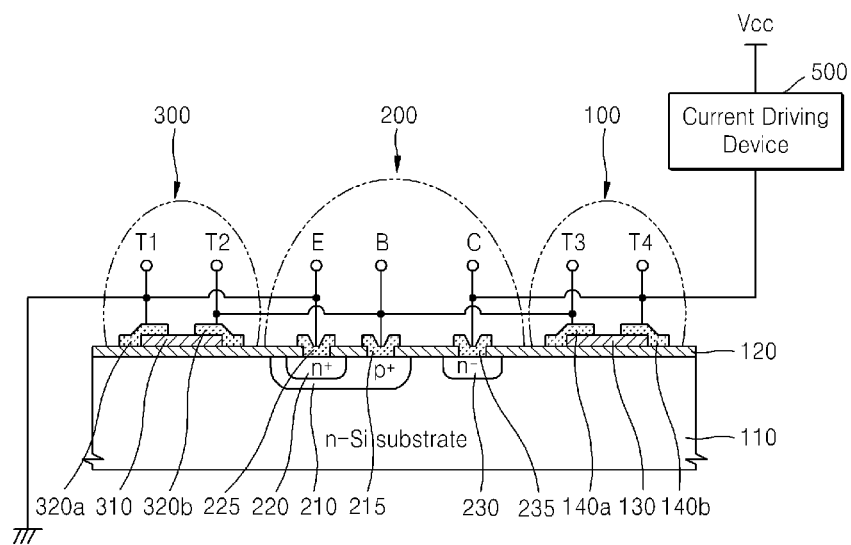
FIG. 4B is a cross-sectional view of a MIT device self-heating preventive-circuit integrated device in which a bipolar transistor, a MIT device, and a resistor of the MIT device self-heating preventive-circuit of FIG. 4A are integrated into one chip, according to an embodiment of the present invention.

FIG. 4B is a cross-sectional view of a MIT device self-heating preventive-circuit integrated device in which the bipolar transistor 200, the MIT device 100, and the resistor 300 of the MIT device self-heating preventive circuit of FIG. 4A are integrated into one chip, according to an embodiment of the present invention.

Referring to FIG. 4B, the MIT device self-heating preventive-circuit according to the current embodiment can be fabricated in one chip on a substrate 110 by integrating each of the devices, that is, the MIT device 100, the bipolar transistor 200, the resistor 300. Hereinafter, the devices are referred to as a 'MIT device self-heating preventive-circuit integrated device'.

The MIT device self-heating preventive-circuit integrated device includes the MIT device 100, the bipolar transistor 200, and the resistor 300 formed on the substrate 110. The MIT device 100 includes a MIT thin film 130 and two MIT electrodes 140a and 140b that contact the MIT thin film 130 on an insulating film 120.

The bipolar transistor 200 includes an active region, for example, a base region 210, an emitter region 220, and a collector region 230, which are formed on an upper region of the substrate 110, and a base electrode 215, an emitter electrode 225, and a collector electrode 235, which respectively contact the base, the emitter, and the collector regions 210, 220, and 230. The insulating film 120 is formed on the substrate 110, and the base electrode 215, the emitter electrode 225, and the collector electrode 235 respectively contact the active region by penetrating the insulating film 120.

The resistor 300, similar to the MIT device 100, includes a resistance thin film 330 and two resistance electrodes 320a and 320b, which contact the resistance thin film 330.

In the meantime, in the MIT device self-heating preventive-circuit integrated device having the above configuration, the electrodes are connected to each other. That is, a first MIT electrode 140b of the MIT device 100 is connected to the collector electrode 235 of the bipolar transistor 200, a second MIT electrode 140a of the MIT device 100 is connected to the base electrode 215 of the bipolar transistor 200 and to a first resistance electrode 320b of the variable resistor device 300, and the emitter electrode 225 of the bipolar transistor 200 is connected to a second resistance electrode 320a of the variable resistor device 300. The connections between the electrodes may be realized by appropriately patterning the metal thin film during a process for forming the MIT electrode. Meanwhile, an external terminal (not shown) that can be connected to the external current driving device 500 may be formed on the first MIT electrode 140b of the MIT device 100. Also, the second resistance electrode 320a of the resistor 300 may be formed and be connected to the ground.

As depicted in FIG. 4B, the MIT device self-heating preventive-circuit according to the current embodiment is packaged after being fabricated into a small chip to which each of the devices is integrated, and thus, can be readily used by being connected to a current driving device that is to be protected. As described above, the MIT device self-heating preventive-circuit can protect the current driving device, and also, allows the current driving device to operate stably by preventing the self-heating phenomenon of the MIT device from occurring.

Figure 5:
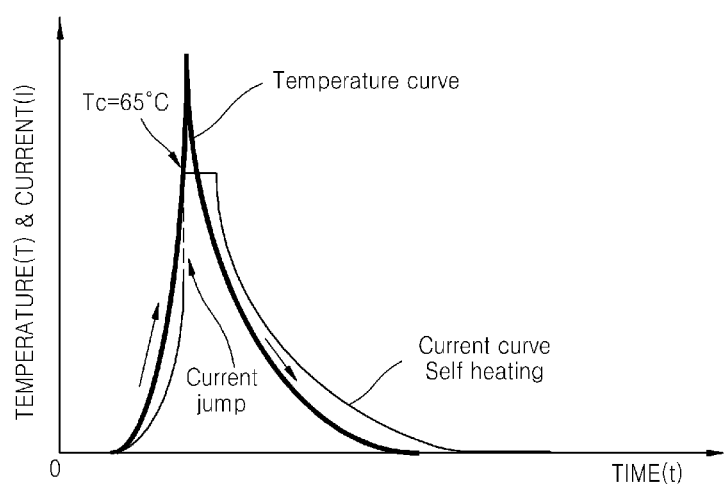
FIG. 5 is a graph showing temperature and current of the MIT device of FIG. 4A according to time, that is, shows a preventive phenomenon of the MIT device from self-heating in the circuit of FIG. 4A.

FIG. 5 is a graph showing temperature and current of the MIT device of FIG. 4A according to time, that is, shows a preventive phenomenon of the MIT device from self-heating in the circuit. The X-axis represents time and the Y-axis represents temperature and current of the MIT device. The bold line indicates ambient temperature of the MIT device, for example, the current driving device, and a dotted line indicates a current in the MIT device.

Referring to FIG. 5, when the ambient temperature is increased beyond a critical temperature, for example, 65° C., the MIT device is transited to a metal state (turn-on) through MIT, and thus, a current jump (dotted line) occurs, and a high current (a current density of greater than $10^5$ A/cm$^2$) flows through the MIT device. Thus, the ambient temperature, that is, the temperature of the current driving device 500 is reduced to below the critical temperature. Meanwhile, the current that flows through the MIT device is also reduced due to the transistor 200 that is turned on immediately after the generation of MIT. Thus, the self-heating in the MIT device can be prevented, and accordingly, the problem that a high current flows through the MIT device due to the self-heating phenomenon can be prevented. As a result, the MIT device can perform a normal switching operation, and accordingly, the current driving device 500 can also perform a stable operation.

Figure 6A:
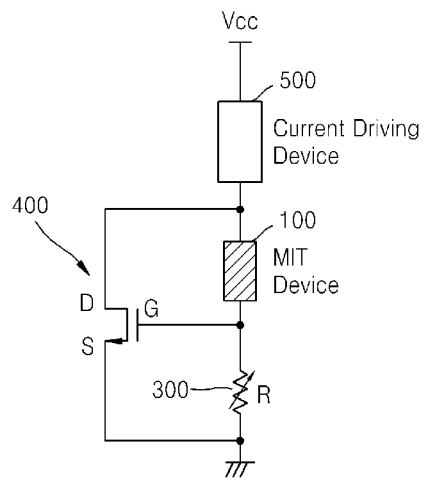
FIG. 6A is a MIT device self-heating preventive-circuit according to another embodiment of the present invention.

FIG. 6A is a MIT device self-heating preventive-circuit according to another embodiment of the present invention.

The MIT device self-heating preventive-circuit of FIG. 6A is similar to the MIT device self-heating preventive-circuit of FIG. 4A; however, a MOS transistor 400 is used in the MIT device self-heating preventive-circuit of FIG. 6A instead of the bipolar transistor 200 which is used in the MIT device self-heating preventive-circuit of FIG. 4A. The MOS transistor 400 may be any type of transistor, for example, a P-MOS transistor, an N-MOS transistor, or a C-MOS transistor.

The connection of the devices in the MIT device self-heating preventive-circuit of FIG. 6A is identical to the connection of the MIT device self-heating preventive-circuit of FIG. 4A when the base electrode 215 of the bipolar transistor 200 is replaced by a gate electrode 415 of the MOS transistor 400, the collector electrode 235 of the bipolar transistor 200 is replaced by a drain electrode 435 of the MOS transistor 400, and the emitter electrode 225 of the bipolar transistor 200 is replaced by a source electrode 425 of the MOS transistor 400. That is, the MIT device 100 is connected between the drain electrode 435 and the gate electrode 415 of the MOS transistor 400, and the resistor 300 is connected between the source electrode 425 and the gate electrode 415 of the MOS transistor 400. The drain electrode 435 of the MOS transistor 400 and a first electrode 140b of the MIT device 100 are connected to the current driving device 500; a second electrode 140a of the MIT device 100 and a first electrode 320b of the resistor 300 are connected to the gate electrode 415 of the MOS transistor 400; the source electrode 425 of the MOS transistor 400 and a second electrode 320a of the resistor 300 are connected to the ground. Here, the MOS transistor 400 is an NMOS transistor, and thus, if a PMOS transistor is used, the electrodes must be connected in consideration of opposite polarity.

With the above connections, an operation of the MIT device self-heating preventive-circuit according to the current embodiment will now be described. If the ambient temperature, for example, the temperature of the current driving device 500, is increased due to an over current, a MIT is generated in the MIT device 100, and thus, a high current flows through the MIT device 100. In the case of the MOS transistor 400, prior to generating the MIT, the MOS transistor 400 is in a turn-off state since a voltage difference between the source electrode 425 and the gate electrode 415 is small. That is, a majority of the voltage is applied to the MIT device 100 and a negligible voltage is applied to the resistor 300, and thus, a voltage applied to the gate electrode 415 is very low. Accordingly, the voltage difference between the source electrode 425 and the gate electrode 415 cannot be greater than a threshold voltage. However, if a MIT is generated in the MIT device 100, the MIT device 100 changes into a metal state, and thus, a high current flows through the MIT device 100. Therefore, a low voltage is applied to the MIT device 100 and a high voltage is applied to the resistor 300. Accordingly, a high voltage is applied to the gate electrode 415, and thus, the MOS transistor 400 is turned on, and a current flows through the MOS transistor 400. As a result, the current that flows through the MIT device 100 is reduced. Also, the MIT device 100 is returned into an insulating state due to the current reduction, and accordingly, the MOS transistor 400 is returned into a turn-off state.

Figure 6B:
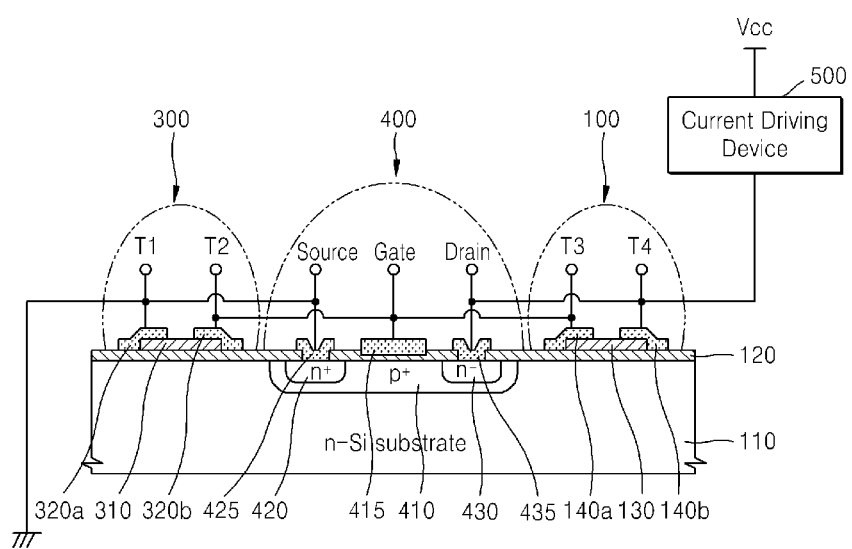
FIG. 6B is a cross-sectional view of a MIT device self-heating preventive-circuit integrated device in which a MOS transistor, a MIT device, and a resistor of the MIT device self-heating preventive-circuit of FIG. 6A are integrated into one chip, according to an embodiment of the present invention.

FIG. 6B is a cross-sectional view of a MIT device self-heating preventive-circuit integrated device in which the MOS transistor 400, the MIT device 100, and the resistor 300 of the circuit of FIG. 6A are integrated into one chip, according to an embodiment of the present invention.

Referring to FIG. 6B, the MIT device self-heating preventive-circuit integrated device of FIG. 6B is similar to the MIT device self-heating preventive-circuit integrated device of FIG. 4B. However, a difference is that the MOS transistor 400 is formed on a central part of the substrate 110 instead of the bipolar transistor 200. Thus, the MIT device self-heating preventive-circuit integrated device includes an active region, that is, a channel region 410, a source region 420, and a drain region 430 on the central part of the substrate 110, the source and drain electrodes 425 and 435 that respectively contact the source and drain regions 420 and 430 on the channel region 410 through the insulating film 120, and the gate electrode 415 formed on insulating film. Conventionally, a channel region is referred to as a portion where a channel is formed between source and drain regions; however, in the current embodiment, for convenience, the channel region 410 is referred to as an entire identical conductive region that includes the portion where the channel is formed.

Besides the MOS transistor 400, the structures of the MIT device 100 and the resistor 300 are identical to the MIT device 100 and the resistor 300 described with reference to FIG. 4B. Also, the connections between the electrodes in the MIT device self-heating preventive-circuit integrated device of FIG. 6B are identical to the connections of FIG. 4B when the base electrode is replaced by a gate electrode 415, the collector electrode is replaced by a drain electrode 435, and the emitter electrode is replaced by a source electrode 425.

FIGS. 7A through 7E are cross-sectional views for describing a method of fabricating a MIT device self-heating preventive-circuit integrated device, according to another embodiment of the present invention.

Figure 7A:
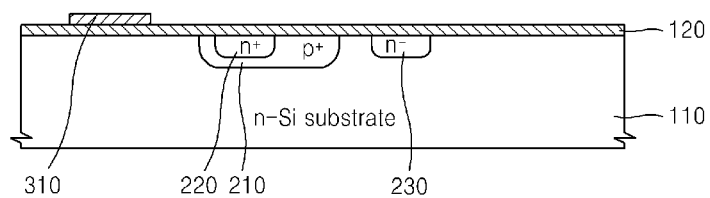
FIGS. 7A through 7E are cross-sectional views for describing a method of fabricating a MIT device self-heating preventive-circuit integrated device, according to another embodiment of the present invention.

Referring to FIG. 7A, an active region for forming a transistor is formed in a substrate 110, and afterwards, a resistance thin film 310 for forming a resistor is formed on an insulating film 120 formed on the entire surface of the substrate 110. The active region includes, for example, a base region 210, an emitter region 220, and a collector region 230 of a bipolar transistor, and conventionally is formed by ion implantation. The active region may be formed after forming the insulating film 120.

The insulating film 120 may be a silicon oxide film grown to a thickness of approximately 200 nm using, for example, a thermal oxidation growing method.

The resistance thin film 310 is formed by patterning a material, which has an appropriate resistance, coated on the insulating film 120 using a photolithography method. For example, the resistance thin film 310 may be formed of a poly silicon thin film doped with an n-type or a p-type dopant having a low concentration, and metal electrodes are attached to both ends thereof. The resistance of the poly silicon thin film may be controlled by appropriately controlling the concentration of the dopant.

The resistance thin film 310 may be located on a side of a portion where the transistor is formed; however, the location of the resistance thin film 310 is not limited thereto.

Figure 7B:
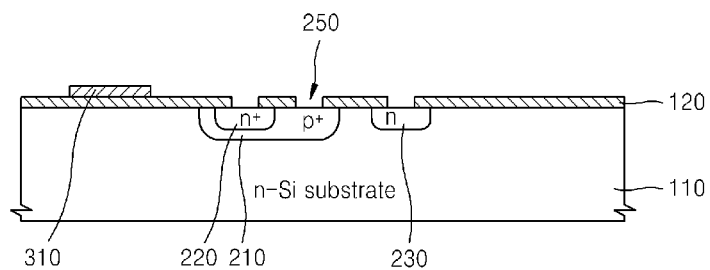

Referring to FIG. 7B, a contact hole 250 for forming a base electrode, an emitter electrode, and a collector electrode is formed in the active region of the insulating film 120. The contact hole 250 may be formed through a dry etching using a PR pattern mask after forming the PR pattern mask through a photolithography process.

Figure 7C:
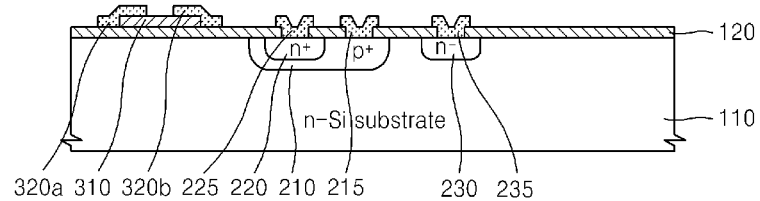

Referring to FIG. 7C, resistance electrodes 320a and 320b are formed on both sides of the resistance thin film 310 and electrodes of a transistor, that is, a base electrode 215, an emitter electrode 225, and a collector electrode 235, are formed.

Figure 7D:
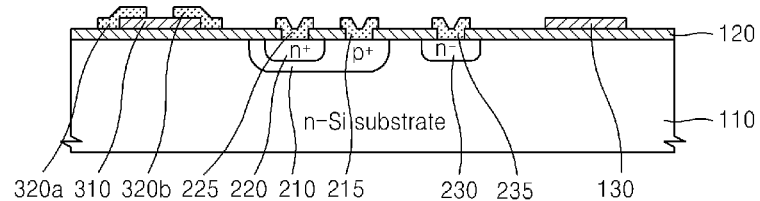

Referring to FIG. 7D, a MIT thin film 130 is formed on the insulating film 120 on a side opposite to the resistance thin film 310 with respect to the location where the transistor is formed. For example, the MIT thin film 130 is formed such that, after forming a $VO_2$ thin film to a thickness of 200 to 300 nm using a sputtering method, and after defining the required area and size of the $VO_2$ thin film through a photolithography process, an unnecessary portion of the $VO_2$ thin film is removed using an ion milling method.

Figure 7E:
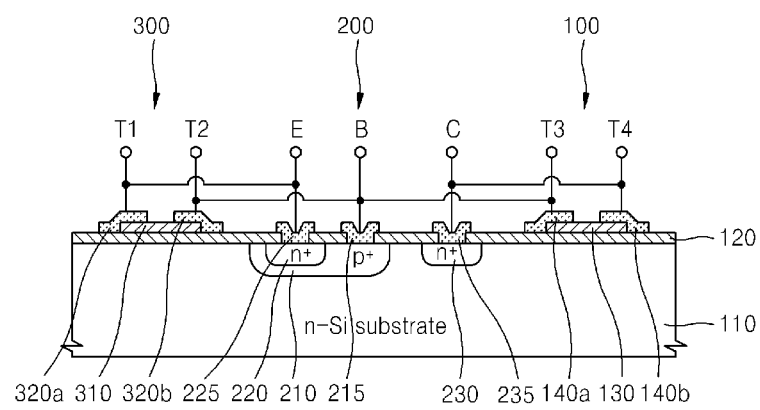

Referring to FIG. 7E, two MIT electrodes 140a and 140b that contact the MIT thin film 130 are formed on both sides of the MIT thin film 130 using a lift-off photolithography process. In the process of forming the MIT electrodes 140a and 140b, the process of connecting the resistance electrodes 320a and 320b of the resistor 300 and each of the electrodes of the transistor 200 to the MIT electrodes 140a and 140b can also be performed. That is, when the process of forming the MIT electrodes 140a and 140b is performed, the MIT electrodes 140a and 140b may be connected to other electrodes by appropriately patterning a metal thin film. The processes of FIGS. 7A through 7C may be referred to as a pre-process for forming the transistor 200 and the resistor 300, and the processes of FIGS. 7D and 7E may be referred to as a post-process for forming the MIT device 100 and connecting the electrodes to each other. The forming of the MIT device 100 will be described in detail with reference to FIGS. 8A through 8F.

So far, the method of forming the MIT device self-heating preventive-circuit integrated device that includes a bipolar transistor has been described; however, a MIT device self-heating preventive-circuit integrated device that includes a MOS transistor can also be formed using a similar method. However, unlike a base electrode of the bipolar transistor, a gate electrode of the MOS transistor does not contact an active region, and thus, a contact hole for forming the gate electrode is unnecessary. Meanwhile, the insulating film 120 at the portion where the gate electrode is formed may be used as a gate insulating film by thinning the insulating film 120 through etching.

FIGS. 8A through 8F are cross-sectional views for detailedly describing a method of fabricating the MIT device portion of the MIT device self-heating preventive-circuit integrated device of FIGS. 7A through 7E, according to another embodiment of the present invention.

Figure 8A:
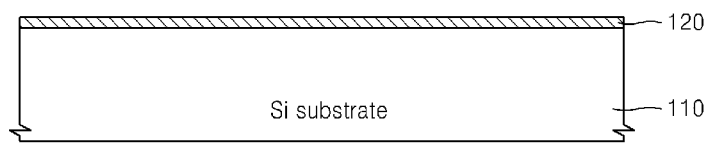
FIGS. 8A through 8F are cross-sectional views for detailedly describing a method of fabricating the MIT device portion of the MIT device self-heating preventive-circuit integrated device of FIGS. 7A through 7E, according to an embodiment of the present invention.

Referring to FIG. 8A, an insulating film 120 is formed on a substrate 110. The insulating film 120 may be a silicon oxide film grown to a thickness of approximately 200 nm using, for example, a thermal oxidation growing method.

Figure 8B:
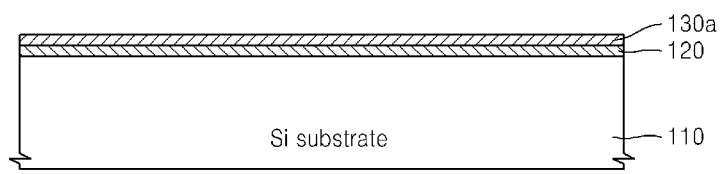

Referring to FIG. 8B, a MIT thin film 130a is formed on an entire upper surface of the insulating film 120. The MIT thin film 130a may be, for example, a $VO_2$ thin film deposited to a thickness of 200 to 300 nm using a sputtering method.

Figure 8C:
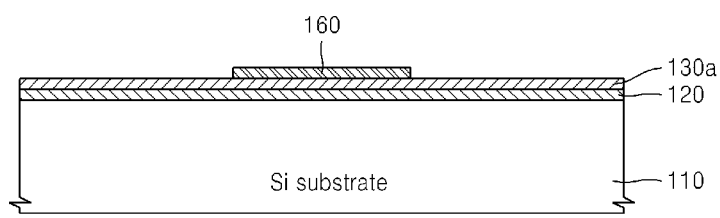

Referring to FIG. 8C, in order to realize a MIT device, the MIT thin film 130a must be formed to an appropriate size. Therefore, a PR pattern 160 that defines the MIT thin film 130a to an appropriate size is formed through a photolithography process.

Figure 8D:
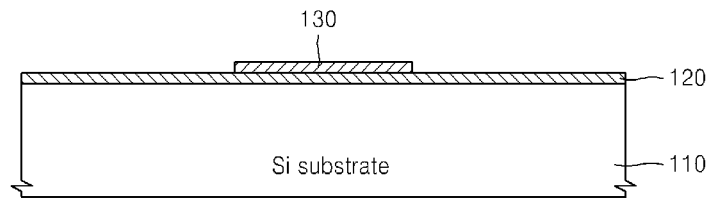

Referring to FIG. 8D, after forming the PR pattern 160, an unnecessary portion of the MIT thin film 130a, except for the portion defined by the PR pattern 160, is removed using an ion milling method, and thus, a MIT thin film 130 having a predetermined size is formed.

Figure 8E:
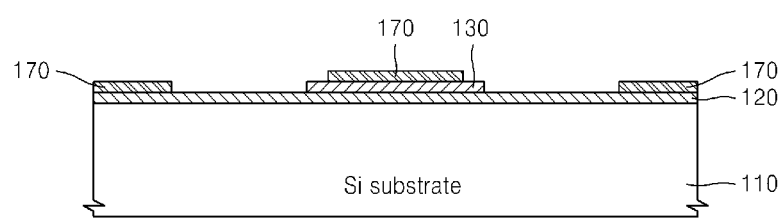

Referring to FIG. 8E, a PR pattern 170, which defines a portion where a MIT electrode is formed, is formed through a photolithography process.

Figure 8F:
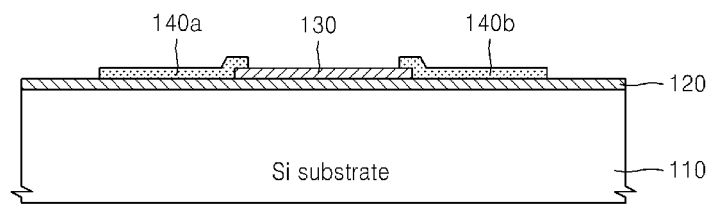

Referring to FIG. 8F, MIT electrodes 140a and 140b are formed on the portions defined for forming the MIT electrodes 140a and 140b. The MIT electrodes 140a and 140b may be formed such that, after forming an interlayer thin film by sequentially depositing Ni/Ti/V to thicknesses of 10 nm, respectively, an Au thin film having a thickness of 700 nm is deposited on the interlayer thin film. The metal thin films except for the portions where the MIT electrodes 140a and 140b are formed are removed by removing PR using acetone.

Here, the processes of FIGS. 8E and 8F, which are used to form the MIT electrodes 140a and 140b, are referred to as a lift-off photolithography process. Afterwards, the manufacture of the MIT device 100 is completed by performing a thermal post-treatment.

The MIT device self-heating preventive-circuit according to the present invention and the method of manufacturing the MIT device self-heating preventive-circuit integrated device can solve self-heating phenomenon of the MIT device by configuring a circuit that includes a transistor, the MIT device, and a resistor.

Also, the transistor, the MIT device, and the resistor are integrated and packaged into one chip, and thus, the MIT device self-heating preventive-circuit itself can be miniaturized into one chip and can be used as an integrated device. Thus, the integrated device can be readily used to control current driving of current driving devices in all electric-electronic circuits such as mobile phones, notebook computers, etc.

Figure 9:
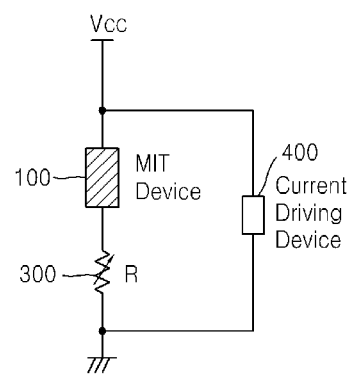
FIGS. 9 and 10 are circuit diagrams illustrating current control circuits according to embodiments of the present invention.
Figure 10:
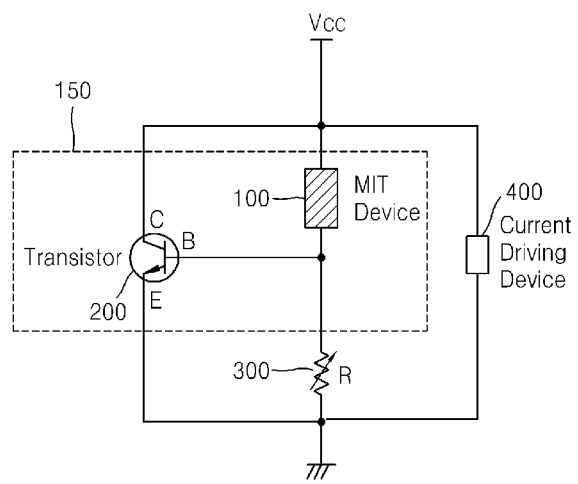

FIGS. 9 and 10 are circuit diagrams of current control circuits according to embodiments of the present invention.

Referring to FIG. 9, the current control circuit according to the current embodiment includes a MIT device 100 and a current driving device 400 that is connected parallel to the MIT device 100. Also, the current control circuit may further include a variable resistor R 300 that is connected to the MIT device 100 in series. With this configuration, the MIT device 100 controls the current supply of the current driving device 400. That is, when an over current is applied to the current driving device 400 or when heating is generated due to malfunctions of the current driving device 400, the resistance of the MIT device 100 is abruptly decreased and the current bypasses through the MIT device 100, thereby protecting the current driving device 400. The current driving device 400 may be a high power light emitting diode (LED) or a high power diode.

Referring to FIG. 10, the current control circuit according to the current embodiment includes a MIT-transistor 150 including a MIT device 100 and a control transistor 200, and a current driving device 400.

The control transistor 200 may be one of an NPN type junction transistor, a PNP type junction transistor, and a MOS transistor. When the control transistor 200 is an NPN type or a PNP type junction transistor, the MIT device 100 is connected between a base electrode and an emitter electrode of the control transistor 200. When the control transistor 200 is a MOS transistor, the MIT device 100 is connected between a gate electrode and a drain electrode of the control transistor 200.

Meanwhile, the current driving device 400 is connected between a collector electrode and the emitter electrode of the control transistor 200. With the above connection, the current driving device 400 is connected parallel to the MIT-transistor 150. Meanwhile, the variable resistor R 300 may be connected between the emitter electrode and the base electrode of the control transistor 200.

Hereinafter, the function of the MIT-transistor 150 will be briefly described. When the ambient temperature of the MIT device 100 is low, the MIT device 100 maintains a high resistance state, and accordingly, the control transistor 200 is also maintained in an off state and thus most of current flows to the current driving device 400. However, when the ambient temperature increases due to the supply of over current to the current driving device 400 or the malfunctions of the current driving device 400, MIT is generated in the MIT device 100 and thus the resistance of the MIT device 100 is decreased. Accordingly, the control transistor 200 is turned on and current flows through the control transistor 200. Thus, when heat is generated in the current driving device 400, the MIT-transistor 150 can efficiently prevent heating of the current driving device 400 by bypassing the current.

The current driving device 400 may also be a high power LED or a high power diode.

Figure 11A:
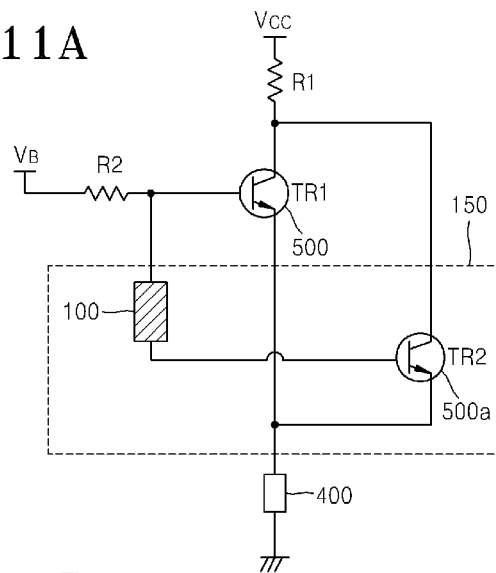
FIGS. 11A and 11B are circuit diagrams illustrating current control circuits according to another embodiments of the present invention.
Figure 11B:
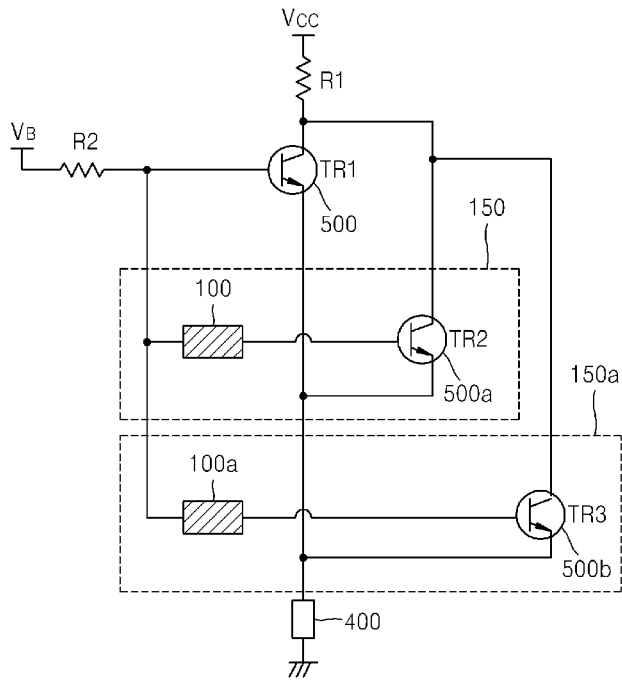

FIGS. 11A and 11B are circuit diagrams of current control circuits according to another embodiments of the present invention.

Referring to FIG. 11A, the current control circuit according to the current embodiment includes a power transistor 500, a MIT-transistor 150 including a MIT device 100 and a control transistor 500a, and a current driving device 400. The MIT device 100 and the control transistor 500a form the MIT-transistor 150, as in FIG. 10, but the connection therebetween is different from the one of FIG. 10. In FIG. 11A, the MIT device 100 is connected between a base electrode of the power transistor 500 and a base electrode of the control transistor 500a. Meanwhile, the MIT device 100 is connected between a base electrode of the power transistor 500 and a resistor R2, and a base current that is applied to the base electrode of the power transistor 500 may be controlled through the resistor R2. Meanwhile, the control transistor 500a is connected parallel to the power transistor 500. That is, collector electrodes of the control transistor 500a and the power transistor 500 are connected to each other, and so are emitter electrodes thereof.

With the above connections, an operation of the current control circuits will now be described. As the temperature is increased due to the heating of the power transistor 500, MIT is generated in the MIT device 100 and the resistance of the MIT device 100 is abruptly decreased. Accordingly, the base current that is applied to the base electrode of the power transistor 500 is reduced and a current flowing between the collector and emitter electrodes of the power transistor 500 is also reduced, thereby reducing the temperature of the power transistor 500. Meanwhile, the control transistor 500a is turned on and a current flows between the collector and emitter electrodes of the control transistor 500a. Consequently, the reduced current in the power transistor 500 is compensated for in the control transistor 500a, and thus, the current flowing to the current driving device 400 is hardly reduced. Then the temperature of the power transistor 500 is reduced, and the MIT device 100 has a high resistance again, and the control transistor 500a is turned off and the current flowing through the power transistor 500 is also restored as it was before.

The current control circuit according to the current embodiment can uniformly apply a current to the current driving device 400 and efficiently prevent heating of the power transistor 500 at the same time. The power transistor 500 and the control transistor 500a in the current embodiment are formed of junction transistors, but may also be formed of MOS transistors. Also, the resistor R2 is connected between a base power source $V_B$ and the base electrode of the power transistor 500, and a resistor R1 is connected between a power $V_{CC}$ and the collector electrode of the power transistor 500. However, other resistors may be further connected between the units according to necessity. For example, a resistor may be connected between a contact point of the base electrode of the power transistor 500 and the MIT device 100.

Referring to FIG. 11B, the current control circuit further includes a second

MIT-transistor 150a that is connected parallel to the power transistor 500. The second MIT-transistor 150a includes a second MIT device 100a and a second control transistor 500b. Heating of the power transistor 500 can be controlled using the MIT-transistor 150, and heating of the control transistor 500a can also be controlled using the second MIT-transistor 150a. In other words, the current control circuit according to the current embodiment controls heating of the power transistor 500 using two MIT-transistors: the MIT-transistor 150 and the second MIT-transistor 150a, and also, heating of the MIT-transistor 150 and the second MIT-transistor 150a is controlled between them. In FIG. 11B, two MIT-transistors are illustrated, but obviously, two or more MIT-transistors may also be connected parallel to the power transistor 500.

Figure 12A:
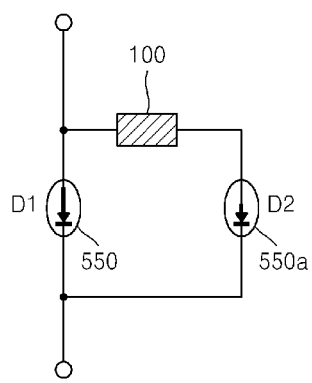
FIGS. 12A and 12B are circuit diagrams illustrating diode current control circuits according to embodiments of the present invention.
Figure 12B:
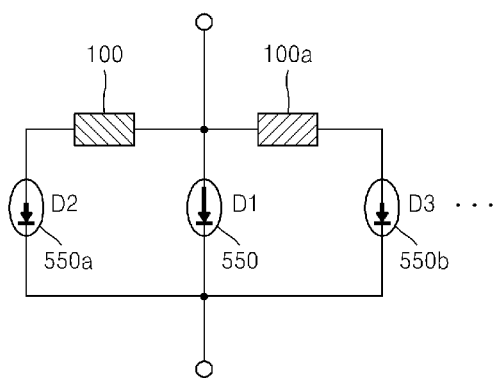

FIGS. 12A and 12B are circuit diagrams of diode power control circuits according to embodiments of the present invention.

Referring to FIG. 12A, the diode power control circuit according to the current embodiment includes a MIT device 100 and two, first and second diodes 550 and 550a connected to the MIT device 100; here, one of the two diodes is connected in series to the MIT device 100, and the other of the two diodes is connected parallel to the MIT device. Thus the diode power control circuit controls the supply of current to the first and second diodes 550 and 550a using the MIT device 100. As shown in FIG. 12A, the arrow of the second diode 550a connected to the MIT device 100 is illustrated to be shorter than the arrow of the first diode 550 because the MIT device 100 usually functions as a resistor and thus less current is supplied to the second diode 550 accordingly. Meanwhile, when a problem occurs such that the first diode 550 is heated, the resistance of the MIT device 100 is reduced due to the generation of MIT, and thus more current is supplied to the second diode 550a.

Although the MIT device 100 is described with respect to the current embodiment, not only the MIT device 100 but other devices that can control current may be connected instead of the MIT device 100. For example, a thermistor or a resistor whose resistance varies or is constant according to temperature may be connected in place of the MIT device 100. Also, although not illustrated in the drawing, a power source and a ground may be connected as upper and lower terminals.

Here, a diode is a pn junction diode and may include a light emitting diode (LED). The LED may include all types of lighting device using a LED such as a LED light bulb or a fluorescent lamp.

Referring to FIG. 12B, the diode power control circuit according to the current embodiment is similar to the diode power control circuit of FIG. 12A but includes more MIT devices and diodes. That is, diodes are respectively connected to the MIT devices in series or in parallel. Accordingly, the number of diodes is one more than the number of MIT devices. The function of the diode power control circuit is as described above, and other devices that can control current, such as a thermistor or a resistor, may also be connected instead of the MIT devices.

The diode power control circuits described with reference respect to FIGS. 12A and 12B may be packaged into one chip. If a diode is used as a LED, a low heating LED may be realized by packaging a diode power control circuit including a diode and a current control device that is one selected among a MIT device, a thermistor, and a resistor, with a light-transmitting lens or a light-transparent material. Thus, various illumination systems can be manufactured using the low heating LED. For example, a LED illumination system including a LED light bulb or a LED fluorescent lamp, which is manufactured by connecting the low heating LED in series and parallel in an array, may be realized. The diode power control circuit may be widely applied in various power systems such as power illumination systems, large power supply power systems, etc.

The structures and functions of the MIT self-heating preventive-circuits, the current control circuits, and the diode current control circuits according to the embodiments of the present invention are described above. The above control circuits can be widely used in various power systems including the current driving device. For example, the control circuits can be used in mobile phones, computers, battery charging circuits, motor control circuits, power amplifiers, power control circuits and power supplies of electric-electronic appliances, integrated circuits, and control circuit systems of LED light bulbs or LED fluorescent lamps. Also, as the control circuits according to the embodiments of the present invention are packaged into one chip as described above, the control circuits can be easily connected to the current driving power systems to be used therein.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A metal-insulator transition (MIT) device self-heating preventive-circuit comprising:
    a MIT device that generates an abrupt MIT at a temperature equal to or greater than a critical temperature and is connected to a current driving device to control the flow of current in the current driving device;
    a transistor that is distinct from but connected to the MIT device to control the self-heating of the MIT device after generating the MIT in the MIT device; and
    a resistor that is distinct from but connected to the MIT device and the transistor,
    wherein the resistor is connected between a base or gate electrode and an emitter or source electrode of the transistor, and
    wherein the current driving device is distinct from the MIT device and the transistor, a first terminal of the current driving device is connected to a power source and a second terminal of the current driving device is connected to the MIT device and the transistor.

2. The MIT device self-heating preventive-circuit of claim 1, wherein
    the transistor is a bipolar transistor, and
    the MIT device is connected between a base electrode and a collector electrode of the bipolar transistor.

3. The MIT device self-heating preventive-circuit of claim 2, wherein the bipolar transistor is one of an NPN type transistor and a PNP type transistor.

4. The MIT device self-heating preventive-circuit of claim 1, wherein
    the transistor is a Metal-Oxide-Semiconductor (MOS) transistor, and
    the MIT device is connected between a gate electrode and a drain electrode of the MOS transistor.

5. The MIT device self-heating preventive-circuit of claim 4, wherein the MOS transistor is one of a P-MOS, a N-MOS, and a C-MOS transistor.

6. The MIT device self-heating preventive-circuit of claim 1, wherein the MIT device, the transistor, and the resistor are integrated and packaged into one chip.

7. The MIT device self-heating preventive-circuit of claim 6, wherein the MIT device self-heating preventive-circuit integrated into one chip has a structure that comprises:
    a substrate;
    a transistor formed on a central portion of the substrate;
    the MIT device formed on a side of the transistor on the substrate; and
    a resistor formed on the other side of the transistor on the substrate.

8. The MIT device self-heating preventive-circuit of claim 7, wherein
    the MIT device comprises a MIT thin film formed on an insulating film on the substrate and at least two MIT electrodes formed on both sides of the MIT thin film on the insulating film, and
    the resistor comprises a resistance thin film formed on the insulating film on the substrate and two resistance electrodes formed on both sides of the resistance thin film on the insulating film.

9. The MIT device self-heating preventive-circuit of claim 7, wherein the transistor is a bipolar transistor or a Metal-Oxide-Semiconductor (MOS) transistor.

10. The MIT device self-heating preventive-circuit of claim 9, wherein,
    if the transistor is the bipolar transistor, the MIT device is connected between a base electrode and a collector electrode of the bipolar transistor, the current driving device is connected to the collector electrode of the bipolar transistor, and the emitter electrode of the bipolar transistor is connected to the ground, and
    if the transistor is the MOS transistor, the MIT device is connected between a gate electrode and a drain electrode of the MOS transistor, the current driving device is connected to the drain electrode of the MOS transistor, and the source electrode of the MOS transistor is connected to the ground.

11. The MIT device self-heating preventive-circuit of claim 1, wherein the MIT device generates a MIT due to the change of physical characteristics of a material, such as temperature, pressure, voltage, and electromagnetic waves.

12. The MIT device self-heating preventive-circuit of claim 1, wherein the MIT device comprises a MIT thin film that generates MIT at a temperature equal to or greater than a critical temperature.

13. The MIT device self-heating preventive-circuit of claim 12, wherein the MIT device is formed of $VO_2$.

14. A method of manufacturing a metal-insulator transition (MIT) device self-heating preventive-circuit integrated device comprising:
    forming a transistor and a resistor on a substrate comprising:
        preparing a substrate;
        forming an active region in the substrate to form a transistor on the substrate;
        forming an insulating film on the substrate before or after forming of the active region;
        forming a resistance thin film on the substrate;
        exposing a portion of the active region by etching a predetermined portion of the insulating film; and
        forming electrodes that contact the active region and the resistance thin film; and
    forming a MIT device on the substrate.

15. The method of claim 14, wherein the forming of the MIT device comprises:
    forming an MIT thin film on the substrate;
    patterning the MIT thin film to a predetermined size using a photolithography process; and
    forming at least two MIT electrodes that contact the patterned MIT thin film.

16. The method of claim 15, wherein the MIT electrodes comprise an interlayer thin film, in which Ni/Ti/V are sequentially stacked in the order stated, and an Au thin film formed on the interlayer thin film.

17. The method of claim 15, wherein, in the forming of the MIT electrodes, the MIT electrodes are connected to the electrodes of the transistor and the resistor.

18. The method of claim 17, wherein
    the transistor is a bipolar transistor,
    the two MIT electrodes of the MIT device are respectively connected to a base electrode and a collector electrode of the bipolar transistor, and
    two resistance electrodes of the resistor are respectively connected to the base electrode and an emitter electrode of the bipolar transistor.

19. The method of claim 17, wherein
the transistor is a MOS transistor,
the two MIT electrodes of the MIT device are respectively connected to a gate electrode and a drain electrode of the MOS transistor, and
two resistance electrodes of the resistor are respectively connected to the gate and a source electrode of the MOS transistor.

20. A current control circuit comprising:
a metal-insulator transition (MIT) device in which an abrupt MIT is generated at a temperature equal to or greater than a critical temperature;
a current driving device connected parallel to the MIT device;
a power source distinct from the current driving device supplying a current to the MIT and the current driving device; and
a transistor distinct from the current driving device preventing self-heating of the MIT device,
wherein first terminals of the MIT device and of the current driving device are connected to the power source, second terminals of the MIT device and of the current driving device are connected to a ground, the MIT device is connected between a base electrode and a collector electrode of the transistor, and the MIT device controls the current applied to the current driving device.

21. The current control circuit of claim 20, further comprising a resistor connected in series to the MIT device,
wherein the second terminal of the MIT device is connected to the ground via the resistor.

22. A current control circuit comprising:
a metal-insulator transition (MIT)-transistor comprising a MIT device generating an abrupt metal-insulator transition at a temperature equal to or greater than a critical temperature and a control transistor connected to the MIT device; and
at least one power transistor that is connected to a current driving device to supply power to the current driving device and to control the power to the current driving device,
wherein the MIT-transistor is attached to a surface of the power transistor or a heating portion of the power transistor , and is connected to a base electrode, a gate electrode, a collector electrode, or a drain electrode of the power transistor, and
when the temperature of the power transistor increases, the MIT-transistor reduces or cuts a current of the power transistor to prevent heating of the power transistor.

23. The current control circuit of claim 22, wherein a base electrode or a gate electrode of the control transistor is connected to the base electrode or the gate electrode of the power transistor via the MIT device, and an emitter electrode or a source electrode of the control transistor is connected to an emitter electrode or a source electrode of the power transistor, and a collector electrode or a drain electrode of the control transistor is connected to the collector electrode or the drain electrode of the power transistor, and
when the temperature of the power transistor is increased while the power transistor is turned on and a current is supplied to the current driving device, the MIT-transistor reduces or cuts the current of the power transistor and allows the current to flow through the control transistor, to prevent heating of the power transistor.

24. The current control circuit of claim 23, wherein at least two of the MIT-transistors are connected parallel to the power transistor, and
the control transistor of each of the MIT-transistors is connected to the MIT device of each of the MIT-transistors and to the power transistor in the same manner.

* * * * *